United States Patent [19]
Fu et al.

[11] Patent Number: 6,059,945
[45] Date of Patent: May 9, 2000

[54] SPUTTER TARGET FOR ELIMINATING REDEPOSITION ON THE TARGET SIDEWALL

[75] Inventors: Jianming Fu, San Jose; James van Gogh, Sunnyvale, both of Calif.

[73] Assignee: Applied Materials, Inc., Santa Clara, Calif.

[21] Appl. No.: 09/165,662

[22] Filed: Oct. 3, 1998

Related U.S. Application Data

[62] Division of application No. 08/702,823, Aug. 23, 1996, Pat. No. 5,914,018.

[51] Int. Cl.[7] .................................................. C23C 14/34
[52] U.S. Cl. .............................. 204/298.12; 204/298.11
[58] Field of Search ..................... 204/298.12, 298.13, 204/298.17, 298.18, 298.19, 298.21, 298.22

[56] References Cited

U.S. PATENT DOCUMENTS

| | | | |
|---|---|---|---|
| 5,529,673 | 6/1996 | Strauss et al. | 204/298.12 |
| 5,538,603 | 7/1996 | Guo | 204/192.12 |
| 5,580,428 | 12/1996 | Krivokapic et al. | 204/192.12 |
| 5,658,442 | 8/1997 | Van Gogh et al. | 204/298.12 |
| 5,690,795 | 11/1997 | Rosenstein et al. | 204/192.1 |

FOREIGN PATENT DOCUMENTS

| | | | |
|---|---|---|---|
| 0 511 733 | 11/1992 | European Pat. Off. | 204/298.11 |
| 0 625 792 | 11/1994 | European Pat. Off. | 204/298.12 |
| 150 482 | 9/1981 | Germany | 204/298.12 |
| 63-238269 | 10/1988 | Japan | 204/298.12 |

OTHER PUBLICATIONS

Lester, et al., IBM Tech. Discl. Bulletin, "Sputtering Cathode Glow Suppression Shields", Aug., 1977, vol. 20, No. 3, pp. 1177–1178.

U.S. application No. 08/702,823, Fu, et al., filed Aug. 23, 1996.

*Primary Examiner*—Rodney McDonald
*Attorney, Agent, or Firm*—Thomason, Moser & Patterson

[57] ABSTRACT

An improved sputter target and shield eliminate redeposition of sputtered material onto the target and prevents the formation of deposits on the electrically insulative member between the target and enclosure wall. The sputter target is designed to allow the plasma to sputter the entire sidewall of the target while the a narrow passage between the target, backing plate and shield protects the insulative member from line-of-sight deposition, prevents formation of a plasma within the passage without causing arcing between the backing plate and shield. The target of the present invention is generally disk-shaped with a sloped or frusto-conical sidewall surface around the perimeter edge.

17 Claims, 5 Drawing Sheets

SPUTTER TARGET FOR ELIMINATING REDEPOSITION ON THE TARGET SIDEWALL

This is a divisional of application Ser. No. 08/702,823 filed on Aug. 23, 1996 now U.S. Pat. No. 5,914,018.

BACKGROUND OF THE INVENTION

1. Field of the Invention

The present invention relates to a sputter target that eliminates sputtered particles from redepositing on the sidewalls of the target. More particularly, the present invention relates to a sputter target having a sidewall that is itself sputtered so that any redeposited species will be immediately cleaned by ion sputtering.

2. Background of the Related Art

The process of sputtering is a physical vapor deposition (PVD) technique in which a solid metal, such as aluminum, is used as the source (also referred to as the "target"). The metal atoms are produced by dislodging them from the target with high energy ion bombardment. The high energy ions that cause sputtering are those of an inert gas like argon generated by a plasma.

Figure 1:
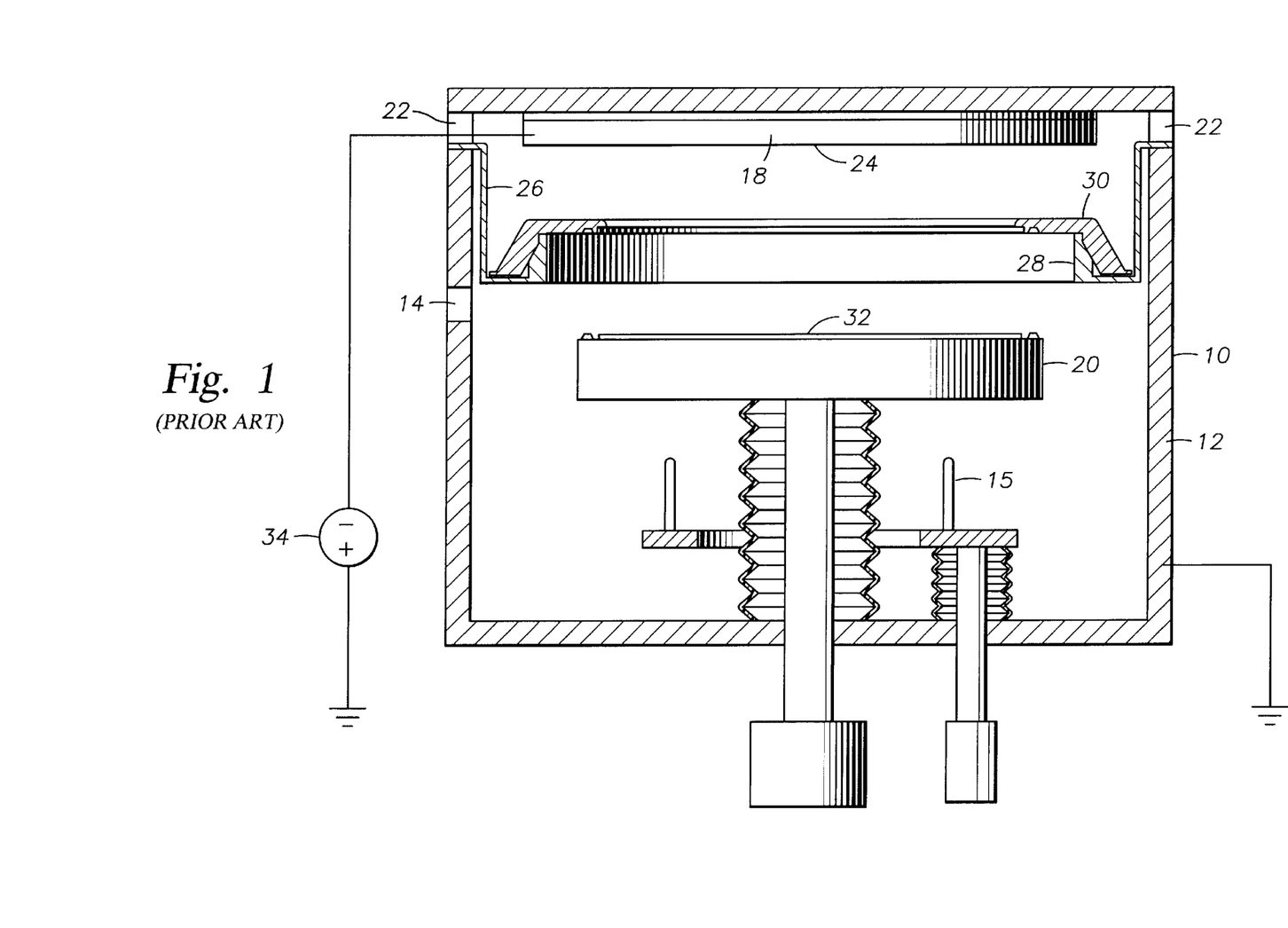
FIG. 1 is a simplified cross-sectional view of a conventional sputtering chamber including a conventional sputtering target.

A simplified sectional view of a conventional sputtering chamber is shown in FIG. 1 including a conventional sputtering target. The chamber 10 generally includes a chamber enclosure wall 12, having at least one gas inlet 14. A substrate support pedestal 20 is disposed at the lower end of the chamber 10, and a target 18 is received at the upper end of the chamber 10. The target 18 is electrically isolated from the enclosure wall 12 by an insulative member 22, such as aluminum oxide, which is generally positioned above the lower target surface 24 to avoid the formation of deposits thereon that could form an electrical short circuit between the target 18 and enclosure wall 12. The enclosure wall 12 is preferably grounded, so that a negative voltage may be maintained on the target 18 with respect to the grounded enclosure wall 12. A shield 26 may be suspended within the chamber 10 and include an annular, upturned, wall 28 on which a clamp ring 30 (or perhaps a collimator) may be suspended over the pedestal 20 when the pedestal 20 is retracted downwardly in the chamber 10 as shown in FIG. 1.

In bias sputtering, the chamber is used to form a metal film by sputtering particles from a target 18 onto a substrate 32 being held at a negative potential with respect to the plasma generated by a power source 34. A major portion of the sputtered metals atoms or groups of atoms follow a substantially linear trajectory over a distribution of angles due to the low pressure maintained in the chamber. The gas composition and pressure in the sputtering chamber 10 is typically achieved by evacuating the chamber down to about $10^{-7}$ Torr before back-filling the chamber with argon to a pressure of a few millitorr. At these gas pressures, the pedestal 20 can be raised upward within the chamber so that the distance between the target 18 and the substrate 32 can be less than the mean free path of the argon gas molecules. Therefore, many sputtered particles travel directly to the substrate without a collision.

However, a significant portion of the sputtered particles become scattered in the gas, due to collisions with the gas, electrical field effects and the like. These scattered particles can redeposit onto various surfaces of the chamber, including the walls 12, the insulative member 22, the pedestal 20, the clamp ring 30 or shield member 26, and the target 18 itself. Redeposition of a conductive sputter material onto the insulative member 22 will eventually form an electrical short between the target 18 and the enclosure wall 12 requiring that the chamber by shut down and cleaned. Redeposition onto other chamber surfaces can lead to a buildup of material that will periodically flake off, thereby generating undesired particles that can then cause fatal defects in the integrated circuit.

Efforts aimed at reducing the concentration of particles in sputter chambers have taken many different approaches. For example, one method for managing the particle concentration in a chamber involves the use of sputter shields (such as shield 26 in FIG. 1) that prevent sputtered particles from depositing directly on the chamber walls. The sputter shield is periodically replaced as part of the process kit so that the extent of the buildup is limited. This method can reduce the frequency at which the chamber 10 must be cleaned, but a fraction of the sputtered particles still pass around the shield and eventually form deposits on the chamber walls and components so that cleaning is necessary.

Another method of reducing the concentration of particles in the sputter chamber introduces a cleaning gas that reacts with the deposits. The gaseous by-products of these reactions are removed from the chamber through an exhaust port coupled to a vacuum pump. However, the deposition process must be discontinued during the cleaning process and evacuation of the cleaning and by-product gases from the chamber before the deposition process can resume. Therefore, both of the methods just described are aimed at ridding the chamber of deposits that have already formed, rather than preventing the deposits from ever forming.

The redeposition of sputtered material onto the sidewall of the target itself has also been recognized as a source of undesirable particles in the chamber. Sputtered particles that become scattered in the chamber atmosphere can redeposit onto the side of the target and accumulate to form particles or sheets of the material. Direct current (DC) power is applied to the target during sputter deposition on a substrate and then removed from the target between substrates. The target, as well as the redeposited material, is continually being heated and cooled, thereby subjecting itself to thermal stress. Over a period of time, this stress will cause particles of the material redeposited on the target sidewall to come lose and fall onto the substrate.

Figure 3:
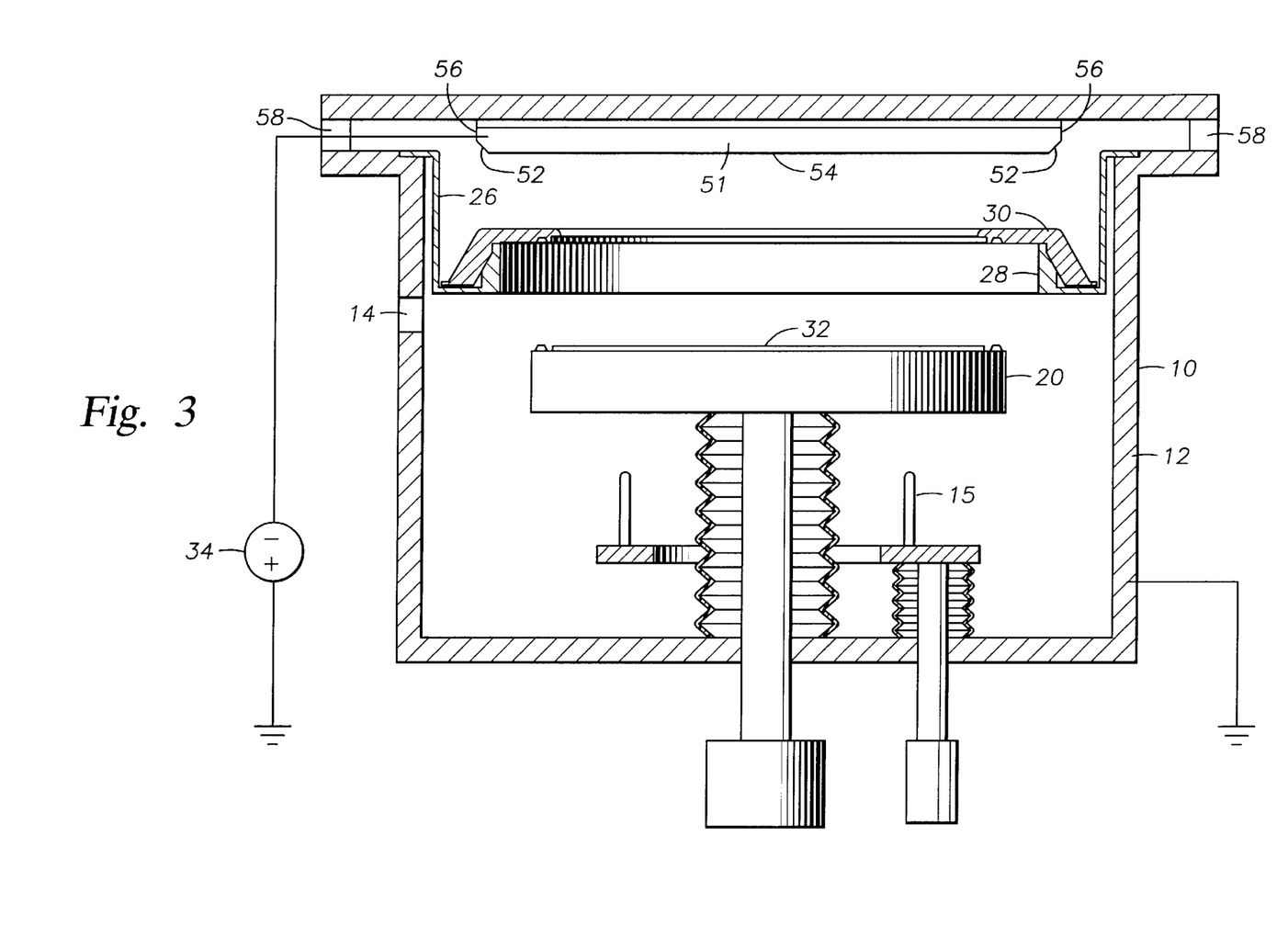
FIG. 3 is a simplified cross-sectional view of a sputtering chamber including a target with a beveled edge and a recessed insulator.

One attempt at preventing redeposition on a target sidewall is shown in FIG. 3. The chamber 50 has a target 51 has a partially beveled perimeter edge 52 that becomes part of the target face 54 that is in contact with the plasma and is sputtered. The beveled edge 52 also effectively reduces the surface area of the sidewall 56 on which redeposition can occur. The sidewall is necessary to avoid line-of sight sputtering of particles directly onto the insulator 58 that electrically isolates the target 51 from the enclosure wall 12.

However, despite the foregoing efforts, there remains a need for a sputter chamber that generates fewer particulates that can damage the integrated circuits being formed. More particularly, there is a need for a sputter chamber and sputter target that eliminate redeposition of sputtered particles onto the target sidewall and prevents a buildup of sputtered material on the insulator. It would be desirable if the chamber required no additional equipment and could be installed as replacement process kit.

SUMMARY OF THE INVENTION

The present invention provides a sputter target for a physical vapor deposition system that eliminates redeposition on the target sidewall. The target comprises a sputterable material having a central region and a sloped edge. The central region may be substantially flat or contoured to achieve desirable deposition characteristics. However, the target is preferably generally round and has a sloped edge that is substantially frustoconical. The target edge slopes with respect to the central region at an angle between about 15 and about 60 degrees, and preferably between about 20 and about 45 degrees. The target may be attached to a backing plate.

The present invention also provides an improved sputter chamber comprising an enclosure, a substrate support member forming an anode and a sputter target facing the substrate support member within the enclosure and electrically isolated from the anode. The target, as described above, is provided in the chamber and coupled to a DC power source for striking a plasma. A sputter shield may also be used in conjunction with the target to protect an insulative member disposed between the backing plate and the enclosure wall from line-of-sight deposition onto the insulative member.

The invention further includes a process kit for a sputtering chamber. The kit comprises a target having a central region, a sloped sidewall and a perimeter edge; and a sputter shield extending towards the perimeter edge of the target to form a gap therebetween. The preferred gap is sufficiently small to prevent the plasma from entering the gap. The sputter shield prevents line-of-sight deposition onto the insulative member.

BRIEF DESCRIPTION OF THE DRAWINGS

So that the manner in which the above recited features, advantages and objects of the present invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefor not to be considered limiting of its scope, for the invention may admit to other equally effective embodiments.

FIGS. 5(a–d) are side views of various target contours within the scope of the present invention.

DETAILED DESCRIPTION OF A PREFERRED EMBODIMENT

The present invention generally provides an improved sputter chamber that eliminates redeposition of sputtered material onto the target and prevents the formation of deposits on the insulative member between the target and enclosure wall. A sputter target and shield are designed to allow the plasma to sputter the entire sidewall of the target while protecting the insulative member from line-of-sight deposition.

Figure 2:
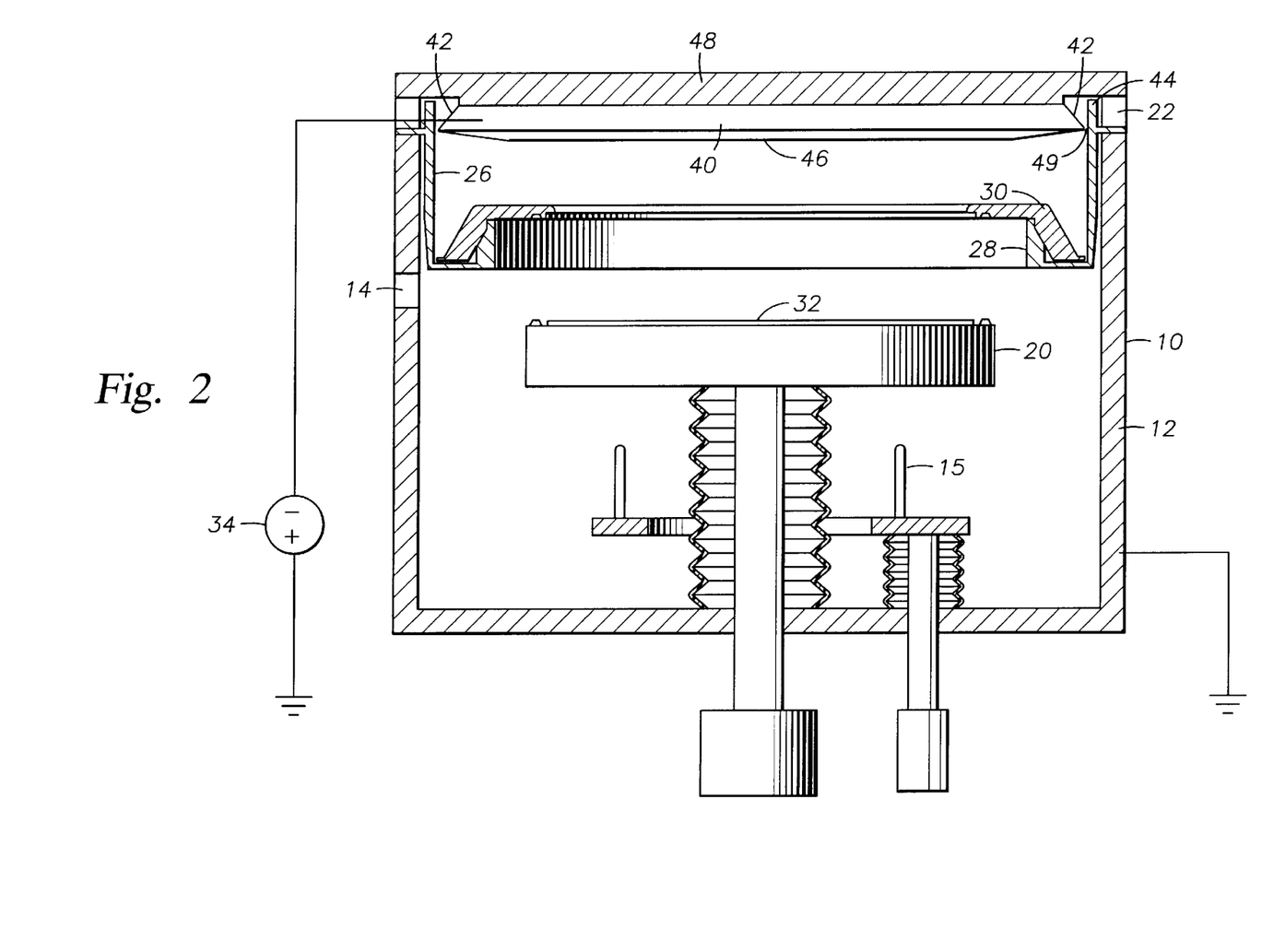
FIG. 2 is a simplified cross-sectional view of a sputtering chamber including a target with an inverted angular ledge and a shield that cooperates with the ledge to reduce redeposition onto the target sidewall.

Now referring to FIG. 2, a novel sputter target and shield design for preventing redeposition on a target sidewall is shown as disclosed in a pending U.S. Patent Application, having a common assignee as the present application. The configuration of target 40 has a sidewall 42 forming an inverted angular ledge there around. The shield 26 has an upper portion 44 that extends above the lower surface 46 of the target 18 and approaches the backing plate 48 in order to form only a narrow passage between the shield 26 and the target sidewall 42. This narrow passage 49 limits the amount of sputter material that can contact the sidewall. Furthermore, the small amount of sputter material that enters through the passage can still deposit on the backing plate 48 or the inverted angular sidewall 42. Therefore, some particle generation is still experienced over time.

Figure 4:
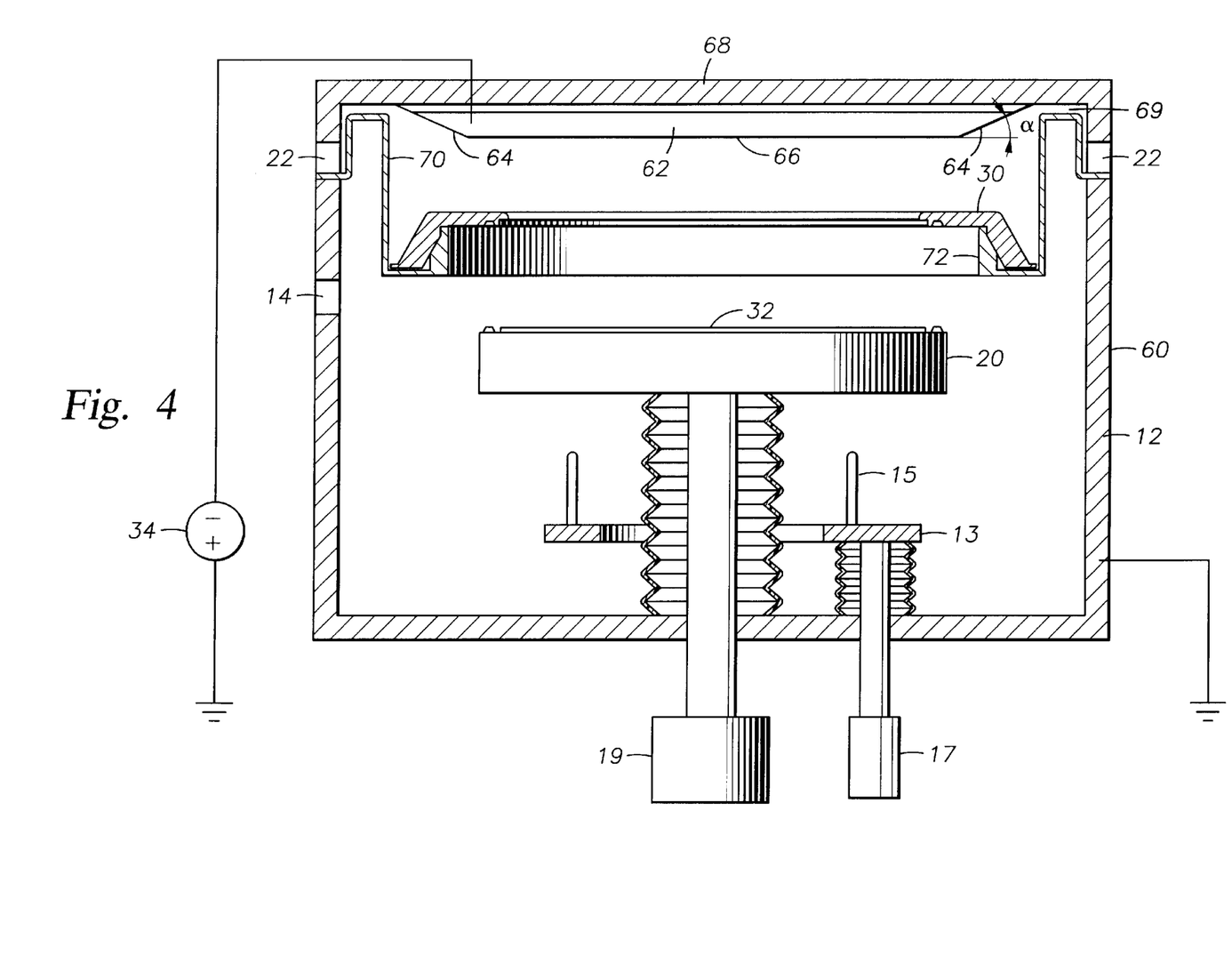
FIG. 4 is a simplified cross-sectional view of a sputtering chamber of the present invention including a target having a sidewall that is sufficiently sloped to become part of the target face that is sputtered by the plasma.
Figure 5A:
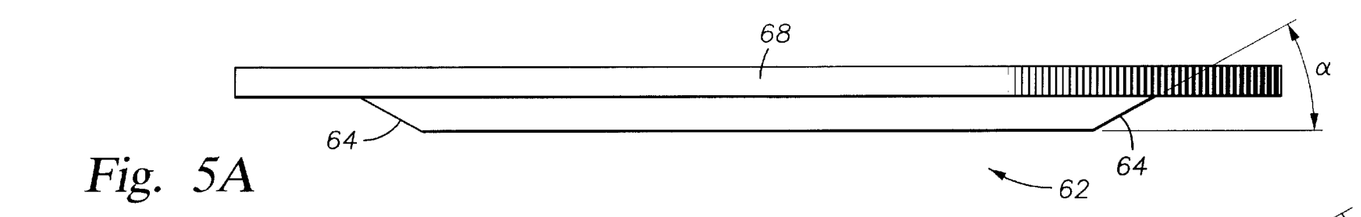
Figure 5B:
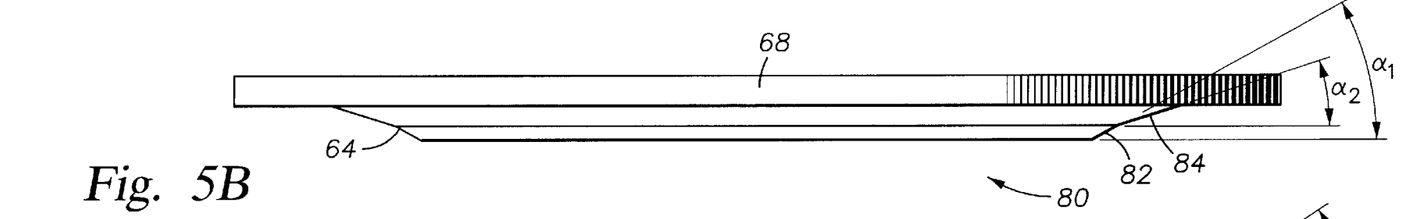
Figures 5C, 5D:
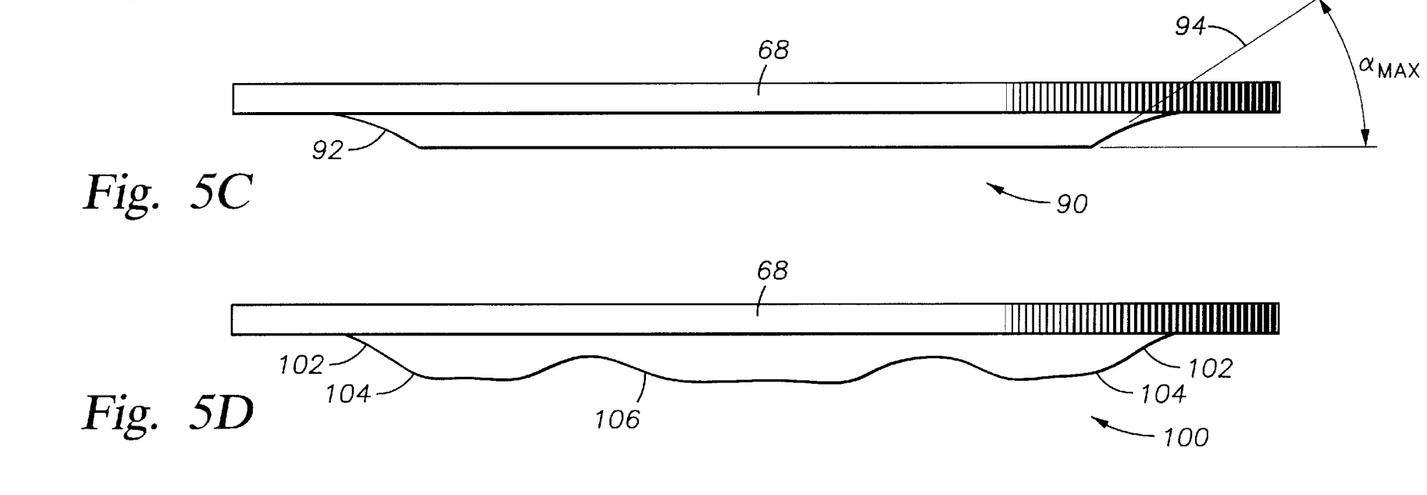

Referring to FIGS. 4 and 5(a–d), a target of the present invention is shown to be generally disk-shaped having a central region and a sloped edge or sidewall surface around the target perimeter. The central region may be substantially flat (see FIGS. 4 and 5(a–c)) or contoured (see FIG. 5(d)) as will be recognized by those in the art. Furthermore, the slope of the edge or sidewall of the target may be constant or varied. The preferred edge 64 is shown in FIG. 5(a) where the target 62 is round and the slope of the edge is constant from the central region 62 to the backing plate 68 to form a frustoconical surface 64. The term "frustoconical", as used herein, means that the surface forms part of a cylindrical cone. The sloped sidewall is sloped with respect to the flat target surface at an angle a that is sufficiently less than normal (less than 90 degree) to allow the plasma to sputter the entire surface of the target, i.e., the sputtered target face includes the flat surface and the sloped sidewall. In this manner, any sputtered particles that are redeposited onto the sloped sidewall are re-sputtered so that material cannot accumulate anywhere on the target face, including the sloped sidewall.

As shown in FIG. 5(b), the target 80 has a sidewall may have more than one sloped portion 82,84, so long as the plasma will sputter all the surfaces. Therefore, both of the individually sloped portions 82,84 should have a slope $\alpha_1$, and $\alpha_2$, respectively, between about 15 and about 60 degrees, with the preferred slopes being between about 30 and about 45 degrees. Furthermore, as shown in FIG. 5(c), the target 90 may have a curved sidewall 92 so long as the plasma will sputter the entire surface. Generally, this will require that lines 92 tangent to the curve 92 have an angle $\alpha_{max}$ within the ranges just defined for sloped portions. Further still, the target 100 shown in FIG. 5(d) has a sidewall 102 having gentle transition or curved surface 104 between the central region 106 and the sidewall 102. FIG. 5(d) also shows a central target region 106 that is contoured.

Referring back to FIG. 4, the target cooperates with a sputter shield that extends upward in close proximity with the point at which the sloped target sidewall meets the backing plate. Therefore, the shield prevents any significant amount of sputter material from redepositing onto the backing plate. If any deposits did accumulate on the backing plate, most particles generated therefrom will remain within the narrow passage formed between the shield and the backing plate. In addition, the shield preferably extends above or near the top of the insulative member to eliminate any line-of-sight deposition from the target. While the insulative member of FIG. 4 is illustrated some distance downward from the backing plate, the insulative member may be positioned at a distance closer to or further from the backing plate within the scope of the present invention, including the position of the insulator of FIG. 1.

One advantage of the present invention is that the target and shield can be used within the installed base of sputter chambers. The target and shield of the present invention can be used in replacement of other target and shields, which would be periodically-replaced anyway as part of the process kit.

Referring once again to FIG. 4, a simplified cross-sectional view of a sputtering chamber 60 of the present invention is shown. The chamber 60 generally includes a chamber enclosure wall 12 having at least one gas inlet 14. A substrate support pedestal 20 is disposed at the lower end of the chamber 60, and a target 62 is received at the upper end of the chamber 60. The target 62 is electrically isolated from the enclosure wall 12 by an insulative member 22, such as aluminum oxide. The enclosure wall 12 is preferably grounded, so that a negative voltage may be maintained on the target 62 with respect to the grounded enclosure wall 12. A shield 70 may be suspended within the chamber 60 and include an annular, upturned, wall 72 on which a clamp ring 30 (or perhaps a collimator) may be suspended over the pedestal 20 when the pedestal 20 is retracted downwardly in the chamber 60 as shown in FIG. 4.

In preparation for receiving a semiconductor wafer or substrate 32 into the chamber 60 for processing, the substrate support pedestal 20 is lowered by a drive mechanism well below the clamp ring 30 suspended on the shield 70 so that the bottom of the pedestal is close to a pin positioning platform 13. The pedestal 20 typically includes three or more vertical bores (not shown), each of which allows a vertically slidable pin 15 to pass therethrough. When the pedestal 20 is in the lowered position just described, the upper tip of each pin 15 protrudes above the upper surface of the pedestal 20. The upper tips of the pins 15 define a plane parallel to the upper surface of the pedestal 20.

A conventional robot arm typically carries the substrate 32 into the chamber 60 and places the substrate 32 above the upper tips of the pins 15. A lift mechanism 17 moves the pin platform 13 upwardly, to place the upper tips of the pins 15 against the underside of the substrate 32 and additionally lift the substrate 32 off the robot blade (not shown). The robot blade then retracts from the chamber 60, and the lift mechanism 19 raises the pedestal 20 above the tips of the pins 15, thereby placing the substrate 32 onto the top surface of the pedestal 20.

The lift mechanism 19 continues to raise the pedestal 20 until the substrate 32 is an appropriate distance from the target 62. When an annular clamp ring 30 is used, the substrate 32 contacts the inner portion of the annular clamp ring resting on the upturned wall portion 72. The inner diameter of the clamp ring 30 is slightly smaller than the diameter of the substrate.

At this point, the film deposition process can begin. A process gas (typically argon) is supplied to the chamber 60 through the gas inlet 14, and a DC power supply 34 applies a negative voltage to the sputtering target 62. The voltage excites the argon gas to a plasma state, and argon ions bombard the negatively biased target 62 to sputter material off the target. The sputtered material then deposits on the substrate 32, except for the periphery thereof which is shielded by the clamp ring 38.

After the film layer has been deposited on the substrate 32, the substrate is removed from the chamber 60 by reversing the sequence of steps by which it was carried into the chamber. Specifically, the lift mechanism 19 lowers the pedestal 20 below the upturned wall portion 72, so that the clamp ring 30 descends so that the weight of the clamp ring 30 is supported by the shield 70, not by the substrate 32 and pedestal 20. The lift mechanism 17 then raises the pins 15 until the substrate 32 is lifted above the surface of the support member 20. The robot blade is then able to enter the chamber to a position below the substrate before the pins 15 are lowered.

In one aspect of the present invention, a chamber 60 is provided that includes a target 62 having a perimeter portion or sidewall 64 that is sufficiently sloped to become part of the target face 66 that is sputtered by the plasma. The slope, as defined by the angle α(alpha) in FIG. 4, is generally between about 15 and about 60 degrees, with the preferred angle α being between about 30 and about 45 degrees. The central, flat portion of the target that is substantially parallel to the substrate will preferably have a diameter that is greater than the diameter of the-substrate. With the target thus designed, the entire face 66 of the target 62 is sputtered and no portion of the target is able to accumulate redeposited material. Since there is no accumulation of redeposited material on the target, the formation of damaging particles is reduced or eliminated.

A shield 70 is also provided within the chamber 60 to limit the redeposition of material onto the backing plate 68 and insulative member 22. The shield 70 extends upward into close proximity with the backing plate adjacent the outer perimeter of the target sidewall 64 to leave only a very narrow passage 69 between the shield 70 and the backing plate 68. The narrow passage provides two features: First, the passage 69 is sufficiently small, defined as the distance between the shield and backing plate, to maintain conditions in the passage which are not conducive to the formation of a plasma in the passage; and, in combination with the shield and target, provides a tortuous path to minimize the potential that a particle will deposit on the backing plate surface exposed about the periphery of the target material. The narrowness of the passage that is required to prevent plasma formation therein can easily be determined, by one skilled in the art, once the gas pressure and potential between the shield and backing plate are known. However, the passage should not be so small or narrow as to allow arcing to occur between the shield and backing plate.

Furthermore, the shield preferably extends above or near the top of the insulative member 22 to prevent any line-of-sight deposition from occurring on the insulative member. The remaining portion of the shield may include any configuration, including accommodations for support of a clamping ring or collimator 30. It is preferred that the shield 70 be a replaceable member, most preferably being part of a process kit that is periodically replaced along with the target 62 or after a multiple of targets. It should also be recognized that whereas the target and shield of the present invention are preferably used together, they may also be used separately.

In another aspect of the invention, a process kit is provided that includes a target 62 and a shield 70 for use in a sputter chamber 60. The process kit is preferably replaced periodically with the target and shield being replaced on the same or different frequencies.

While the foregoing is directed to the preferred embodiment of the present invention, other and further embodiments of the invention may be devised without departing from the basic scope thereof. The scope of the invention is determined by the claims which follow.

What is claimed is:

1. A processing chamber comprising:

an enclosure;

a substrate support member forming an anode;

a sputter target facing the substrate support member within the enclosure and electrically isolated from the anode, wherein the target has a central region and a curved edge having a substantially concave profile; and a DC power source coupled to the target.

2. The processing chamber of claim 1, wherein the substantially curved edge has tangent lines that form angles with respect to the central region of less than about 60 degrees.

3. The processing chamber of claim 1, wherein the substantially curved edge has tangent lines that form angles with respect to the central region of less than about 45 degrees.

4. The processing chamber of claim 1, further comprising a sputter shield disposed around a region between the target and the substrate support member.

5. The processing chamber of claim 4, wherein the target is attached to a backing plate, and wherein the sputter shield extends into close proximity of the backing plate adjacent the target edge.

6. The processing chamber of claim 5, further comprising an insulative member disposed between the backing plate and the enclosure wall to electrically isolate the target from the substrate support member, and wherein the sputter shield prevents line-of-sight deposition onto the insulative member.

7. A target for a physical vapor deposition system, comprising:

a sputterable material having a central region and a curved edge having a substantially concave profile.

8. The target of claim 7, wherein the curved edge has a substantially curved profile having tangent lines that have a maximum angle of about 60 degrees with respect to the central region.

9. The target of claim 7, wherein the curved edge has a substantially curved profile having tangent lines that have a maximum angle of about 45 degrees with respect to the central region.

10. The target of claim 7, wherein the target is attached to a backing plate.

11. The target of claim 10, further comprising an insulative member for electrically isolating the backing plate and the target.

12. A process kit for a sputtering chamber, comprising:

a target having a substantially flat central region and a curved edge having a substantially concave profile;

a sputter shield extending towards the curved edge of the target to form a gap therebetween, wherein the gap is sufficiently small to prevent a plasma from entering the gap.

13. The process kit of claim 12, wherein the target is attached to a backing plate.

14. The process kit of claim 13, further comprising an insulative member electrically insulating the backing plate from a chamber enclosure.

15. The process kit of claim 14, wherein the sputter shield extends between the curved edge of the target and the insulative member to prevent line-of-sight deposition onto the insulative member.

16. The process kit of claim 15, wherein the curved edge has a substantially concave profile having tangent lines that have a maximum angle of about 60 degrees with respect to the central region.

17. The process kit of claim 15, wherein the curved edge has a substantially concave profile having tangent lines that have a maximum angle of about 45 degrees with respect to the central region.

* * * * *

UNITED STATES PATENT AND TRADEMARK OFFICE
CERTIFICATE OF CORRECTION

PATENT : 6,059,945

DATED : May 9, 2000

INVENTOR(S) : Fu et al.

It is certified that error appears in the above-identified patent and that said Letters Patent is hereby corrected as shown below:

In column 4, line 29, after "angle", please replace "a" with "α".

In column 7, line 20, before "proximity", please delete "close".

Signed and Sealed this

Twentieth Day of March, 2001

Attest:

NICHOLAS P. GODICI

*Attesting Officer*  *Acting Director of the United States Patent and Trademark Office*